(12) United States Patent
Iu et al.

(10) Patent No.: US 11,694,919 B2
(45) Date of Patent: Jul. 4, 2023

(54) VACUUM CHUCK PRESSURE CONTROL SYSTEM

(71) Applicant: Applied Materials, Inc., Santa Clara, CA (US)

(72) Inventors: Dongming Iu, Union City, CA (US); Mehran Behdjat, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 374 days.

(21) Appl. No.: 15/464,519

(22) Filed: Mar. 21, 2017

(65) Prior Publication Data

US 2017/0294333 A1 Oct. 12, 2017

Related U.S. Application Data

(60) Provisional application No. 62/320,108, filed on Apr. 8, 2016.

(51) Int. Cl.
*H01L 21/683* (2006.01)
*H01J 37/32* (2006.01)
(Continued)

(52) U.S. Cl.
CPC ....... *H01L 21/6838* (2013.01); *G05D 7/0635* (2013.01); *G05D 16/2013* (2013.01);
(Continued)

(58) Field of Classification Search
CPC ........... H01L 21/6838; H01L 21/67256; H01L 21/67288; H01L 21/67253;
(Continued)

(56) References Cited

U.S. PATENT DOCUMENTS 5,093,579 A * 3/1992 Amemiya ........... G03F 7/70866
250/441.11
5,290,381 A * 3/1994 Nozawa .............. H01L 21/6838
156/345.52
(Continued)

FOREIGN PATENT DOCUMENTS

EP 603396 A1 6/1994
JP H9232415 A 9/1997
(Continued)

OTHER PUBLICATIONS

International Search Report and Written Opinion in related application PCT/US2017021564 dated Jun. 20, 2017.
(Continued)

*Primary Examiner* — Charlee J. C. Bennett
(74) *Attorney, Agent, or Firm* — Patterson + Sheridan, LLP

(57) ABSTRACT

Implementations described herein relate to pressure control for vacuum chuck substrate supports. In one implementation, a process chamber defines a process volume and a vacuum chuck support is disposed within the process volume. A pressure controller is disposed on a fluid flow path upstream from the vacuum chuck and a flow restrictor is disposed on the fluid flow path downstream from the vacuum chuck. Each of the pressure controller and flow restrictor are in fluid communication with a control volume of the vacuum chuck.

7 Claims, 1 Drawing Sheet

(51) Int. Cl.
*H01L 21/67* (2006.01)
*G05D 7/06* (2006.01)
*G05D 16/20* (2006.01)

(52) U.S. Cl.
CPC .... *H01J 37/32009* (2013.01); *H01J 37/3244* (2013.01); *H01J 37/32715* (2013.01); *H01L 21/67253* (2013.01); *H01L 21/67259* (2013.01); *H01L 21/67288* (2013.01)

(58) Field of Classification Search
CPC ............ H01J 37/32009; H01J 37/3244; H01J 37/32715; G05D 7/0635; G05D 16/2013
See application file for complete search history.

(56) References Cited

U.S. PATENT DOCUMENTS

| | | | | |
|---|---|---|---|---|
| 5,609,720 | A * | 3/1997 | Lenz | H01L 21/67103 438/715 |
| 5,810,933 | A * | 9/1998 | Mountsier | H01L 21/67109 118/728 |
| 6,191,035 | B1 * | 2/2001 | Cheng | H01L 21/28568 118/725 |
| 7,156,951 | B1 * | 1/2007 | Gao | H01L 21/67109 118/724 |
| 11,441,224 | B2 * | 9/2022 | Toriya | C23C 16/4583 |
| 2001/0005595 | A1 * | 6/2001 | Morita | G03F 7/707 430/30 |
| 2003/0047199 | A1 * | 3/2003 | Worm | H01L 21/67051 134/158 |
| 2004/0022694 | A1 | 2/2004 | Hara et al. | |
| 2005/0152088 | A1 * | 7/2005 | Ito | G03F 7/707 361/233 |
| 2005/0189074 | A1 | 9/2005 | Kasai et al. | |
| 2006/0011297 | A1 * | 1/2006 | Kim | H01L 21/67184 156/345.31 |
| 2006/0135047 | A1 * | 6/2006 | Sheydayi | H01L 21/6838 451/388 |
| 2006/0289432 | A1 * | 12/2006 | Morita | F27D 3/0084 219/390 |
| 2007/0118246 | A1 * | 5/2007 | Suzuki | H01L 21/6838 118/724 |
| 2007/0248515 | A1 * | 10/2007 | Tompa | C23C 16/407 423/179 |
| 2008/0282975 | A1 * | 11/2008 | Rius | C23C 16/45512 118/666 |
| 2009/0101214 | A1 * | 4/2009 | North | F04B 53/06 137/15.04 |
| 2009/0197356 | A1 * | 8/2009 | Bang | H01L 21/67259 118/696 |
| 2010/0301011 | A1 | 12/2010 | Sneh | |
| 2011/0024047 | A1 | 2/2011 | Nguyen et al. | |

FOREIGN PATENT DOCUMENTS

| | | |
|---|---|---|
| JP | 2001237305 A | 8/2001 |
| JP | 2002313896 A | 10/2002 |
| JP | 2004186555 A | 7/2004 |
| JP | 2014-003186 A | 1/2014 |
| KR | 1020080012628 | 2/2008 |
| KR | 10-2010-0109009 | 10/2010 |
| KR | 1020100109009 | 10/2010 |
| KR | 10-2011-0017678 A | 2/2011 |
| TW | 201036099 A | 10/2010 |
| WO | 03-023826 A2 | 3/2003 |

OTHER PUBLICATIONS

Office Action for Japan Application No. 2018-553081 dated Nov. 26, 2019.
Office Action for Korean Application No. 10-2018-7032365 dated Mar. 6, 2020.
Office Action for Taiwan Application No. 106107894 dated Jul. 20, 2020.
Search Report for Taiwan Application No. 106107894 dated Jul. 6, 2020.
Office Action for Japanese Application No. 2018-553081 dated Jul. 28, 2020.
Office Action for Korean Application No. 10-2018-7032365 dated Sep. 9, 2020.

* cited by examiner

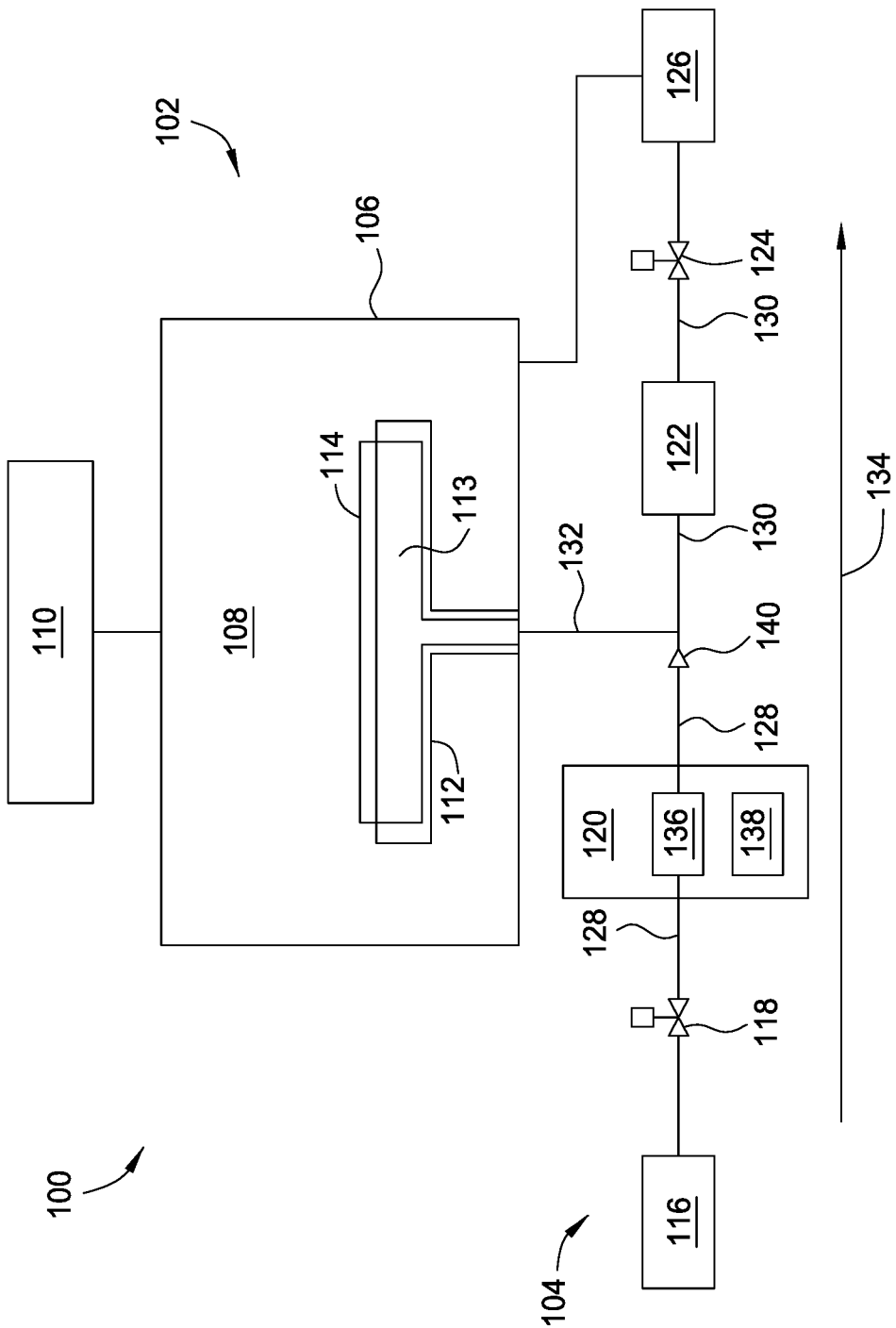

VACUUM CHUCK PRESSURE CONTROL SYSTEM

CROSS-REFERENCE TO RELATED APPLICATIONS

This application claims benefit of U.S. Provisional Patent Application No. 62/320,108, filed Apr. 8, 2016, the entirety of which is herein incorporated by reference.

BACKGROUND

Field

Implementations of the present disclosure generally relate to a vacuum chuck pressure control system. More specifically, implementations described herein relate to substrate backside pressure control having a pressure controller positioned to improve the longevity of the control system

Description of the Related Art

Semiconductor processing technologies generally utilize processing chambers to form microelectronic devices on substrates, such as semiconductor wafers and the like. The substrates are typically positioned and secured on substrate supports disposed within the chambers. The substrate supports provide a stable processing platform upon which the substrates may be processed and the substrate supports may also help facilitate ingress and egress of the substrate from the chamber pre and post-processing.

There are several different types of substrate supports commonly utilized in the semiconductor processing industry. Some substrate supports utilize the force of gravity while others actively secure the substrates to the support. Active substrate supports typically employ electrostatic or vacuum chucking in order to secure a substrate on the substrate support. For example, vacuum chucks typically utilize a substrate backside pressure differential to secure the substrate to the substrate support. However, current backside pressure control schemes for vacuum chucks suffer from an undesirable reduction in the useful life of the pressure controller apparatus due to exposure to harmful outgassing materials from processed substrates.

Thus, what is needed in the art are improved systems and apparatus for vacuum chuck pressure control.

SUMMARY

In one implementation, a substrate processing apparatus is provided. The apparatus includes a process chamber which defines a process volume and a vacuum chuck support may be disposed within the process volume. A pressure controller may be in fluid communication with the vacuum chuck and the pressure controller may be disposed on a fluid flow path upstream from the vacuum chuck. A flow restrictor may be in fluid communication with the vacuum chuck and the pressure controller and the flow restrictor may be disposed on the fluid flow path downstream from the vacuum chuck.

In another implementation, a substrate processing apparatus is provided. The apparatus includes a vacuum chuck support defining a control volume therein and a pressure controller in fluid communication with the control volume. The pressure controller may be disposed on a fluid flow path upstream from the vacuum chuck. A flow restrictor may be in fluid communication with the control volume and the pressure controller and the flow restrictor may be disposed on the fluid flow path downstream from the vacuum chuck.

In yet another implementation, a substrate processing apparatus is provided. The apparatus includes a process chamber which defines a process volume. A vacuum chuck support may be disposed within the process volume and the vacuum chuck may have a control volume separate from the process volume. A pressure controller may be in fluid communication with the control volume of the vacuum chuck and the pressure controller may be disposed on a fluid flow path upstream from the vacuum chuck. A fluid source may be disposed on the fluid flow path upstream from the pressure controller and a flow restrictor may be in fluid communication with the control volume of the vacuum chuck and the pressure controller. The flow restrictor may be disposed on the fluid flow path downstream from the vacuum chuck and a pump may be disposed on the fluid flow path downstream from the flow restrictor.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, may admit to other equally effective implementations.

FIG. 1 illustrates a schematic view of a process apparatus having a vacuum chuck with pressure control apparatus according to implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Implementations described herein relate to pressure control for vacuum chuck substrate supports. In one implementation, a process chamber defines a process volume and a vacuum chuck support is disposed within the process volume. A pressure controller is disposed on a fluid flow path upstream from the vacuum chuck and a flow restrictor is disposed on the fluid flow path downstream from the vacuum chuck. Each of the pressure controller and flow restrictor are in fluid communication with the vacuum chuck. As a result of the positioning of the pressure controller upstream relative to the vacuum chuck, the effective lifetime of the pressure controller may be increased as well as the time interval between cleanings of the pressure controller.

Moreover, because the pressure controller is not exposed to harmful outgas materials from the substrate as a result of being upstream from the vacuum chuck, a more economical flow restrictor may be positioned downstream of the vacuum chuck. The economical flow restrictor can be inspected, cleaned, or replaced during preventative maintenance in a more economical fashion than if the pressure controller were to be replaced. The pressure controller may also implement pressure sensing and flow rate sensing in the upstream position which may enable improved chucking feedback regarding substrate breakage or out of pocket misplacement.

Thus, various advantages may be appreciated from the implementations described herein.

FIG. 1 illustrates a schematic view of a process apparatus 100 having a vacuum chuck 112 with a pressure control apparatus 104. The process apparatus 100 includes a process chamber 102 and the pressure control apparatus 104. Generally, the process apparatus 100 is configured to thermally treat substrates, such as semiconductor substrates, for various processing operations. In one implementation, the process apparatus 100 may function to perform a soak anneal or bake process. The process apparatus 100 may also include apparatus suitable for cleaning the process apparatus 100. It is contemplated that the process apparatus 100 may be a dual chamber system which may be implemented on the PRODUCER® platform available from Applied Materials, Inc., Santa Clara, Calif. However, it is contemplated that the process apparatus 100 may also be advantageously implemented on suitably configured platforms from other manufacturers.

The process chamber 102 includes a chamber body 106 which defines a process volume 108. A vacuum chuck support 112 may be disposed within the process volume 108 and be configured to support a substrate 114 thereon. The vacuum chuck support 112 may include a control volume 113 defined therein which is in fluid communication with the pressure control apparatus 104. The control volume 113 may also be in fluid communication with the process volume 108 when there is no substrate 114 present on the vacuum chuck support 112 or when the substrate 114 is disposed on the vacuum chuck support 112 but a backside of the substrate 114 is not exposed to a vacuum environment via the control volume 113. In other implementations, a flow pathway may exist from the process volume 108 to the control volume 113 that is not blocked by the substrate 114 disposed on the vacuum chuck support 112, so the control volume 113 may be in fluid communication with the process volume 108 when the substrate 114 is disposed on the support 112. For example, an opening in the surface of the support 112 beyond the radius of the substrate 114 may provide such a fluid communication pathway.

Although not illustrated, the vacuum chuck support 112 may include heating apparatus, such as a resistive heater or the like, which facilitates heating of the substrate 114. In operation, the substrate 114 may be heated to a process temperature of between about 700° C. and about 1200° C., such as between about 850° C. and about 1100° C. The heating process may be employed for a multitude of operations, such as dopant diffusion, surface repair, material removal, and the like.

A remote plasma source 110 may be fluidly coupled to the process volume 108 and may be configured to deliver radicals and/or ions to the process volume 108. The remote plasma source 110, which may include a plurality of remote plasma sources, may be configured to generate a plasma remotely from the process volume 108 and deliver the plasma products to the process volume 108 to facilitate cleaning of the process chamber 102. Suitable precursors which may be utilized by the remote plasma source 110 for generating cleaning plasma include noble gases, oxygen, nitrogen, helium, ammonia, fluorine containing materials, and chlorine containing materials, among others. The precursors may be utilized alone or in combination to generate a plasma.

In operation, one or more substrates may be thermally processed by the process chamber 102. After thermal processing of the substrate and removal of the substrates from the process volume 108, the cleaning plasma may be generated by the remote plasma source 110 and the plasma products may be delivered to the process volume 108. The plasma products may function to clean the process chamber 102 and components disposed therein prior to being exhausted from the process volume 108. Thus, the process volume 108 may be cleaned and thermal processing of additional substrate may be resumed.

During thermal processing of the substrate 114, the substrate 114 may be secured on the vacuum chuck support 112. In one implementation, the substrate 114 may be secured on the vacuum chuck support 112 by generating and maintaining a pressure differential between the process volume 108 and the control volume 113. For example, the pressure of the control volume 113 may be less than the pressure of the process volume 108. In one implementation, the pressure of the control volume 113 may be between about 0.5% and about 1.5% less than the pressure of the process volume 108. For example, the pressure of the control volume 113 may be between about 490 torr and about 450 torr, such as about 470 torr, while the pressure of the process volume 108 may be between about 480 torr and about 520 torr, such as about 500 torr. Thus, the backside (the surface of the substrate disposed on the vacuum chuck support 112) of the substrate 114 may be exposed to a reduced pressure environment relative to the front side of the substrate 114. As a result, the substrate 114 may be secured on the vacuum chuck support to prevent movement of the substrate 114 during thermal processing.

The vacuum environment utilized to secure the substrate 114 to the vacuum chuck support 112 may be generated and controlled by the pressure control apparatus 104. The pressure control apparatus 104 includes a fluid source 116, a pressure controller 120, a flow restrictor 122, and a pump 126. The pressure control apparatus 104 also includes a first conduit 128, a second conduit 130, and a third conduit 132. In certain implementations, the third conduit 132 may be a conduit distinct from the control volume 113 or the third conduit 132 may be an extension of the control volume 113. Regardless of the desired implementation, the third conduit 132 is in fluid communication with the control volume 113 and the first and second conduits 128, 130, respectively. One or more valves, such as a first valve 118 and a second valve 124, may also be disposed on one or more of the conduits 128, 130, 132.

The fluid source 116, such as a gas source, is configured to deliver a gas to the control volume 113 and ultimately to the pump 126. The fluid source 116 may deliver an inert gas, such as nitrogen or the like, at a pressure of between about 15 psi and about 45 psi, such as about 30 psi. In one implementation, gas from the fluid source 116 may travel sequentially through the first conduit 128, the pressure controller 120, the third conduit 132, the second conduit 130, and the flow restrictor 122 to the pump 126. In another implementation, gas from the fluid source 116 may travel sequentially through the first conduit 128, the pressure controller 120, the second conduit 130, and the flow restrictor 122 to the pump 126. In this implementation, the gas from the fluid source 116 may not travel through the third conduit 132, however, the control volume 113 may remain in fluid communication with a fluid flow path 134.

Generally, the fluid flow path 134 is defined as the path along which gas from the fluid source 116 travels to the pump 126. Accordingly, the terms "upstream" and "downstream" refer to the relative position of various apparatus disposed on the fluid flow path 134.

In one implementation, the first conduit 128 may extend from the fluid source 116 to the third conduit 132 or the control volume 113. The second conduit 130 may extend from the first conduit 128 to the pump 126. The third conduit 132, or the control volume 113 in certain implementations, may be disposed on the fluid flow path 134 where the first conduit 128 and the second conduit 130 meet.

The pressure controller 120 may be disposed on the first conduit 128 between the fluid source 116 and the control volume 113. The first valve 118 may be disposed on the first conduit 128 between the fluid source 116 and the pressure controller 120. The pressure controller 120 may include pressure detection apparatus 136 and flow detection apparatus 138. As such, the pressure controller 120 may control the pressure of the control volume 113 by detecting the flow rate of the gas through the pressure controller 120. The flow rate detected by the pressure controller 120 may be influenced by one or more of the pressure of the gas provided by the fluid source 116, the presence and/or position of the substrate 114 disposed on the vacuum chuck support 112, the flow restrictor 122, and the pump 126. Accordingly, the pressure controller 120 may detect flow rate feedback from one or a plurality of inputs and adjust the flow rate accordingly to maintain or generate a desired pressure in the control volume 113.

The pressure controller 120 may include flow controlling apparatus, such as valves and the like, to control the flow of gas from the fluid source 116 to the control volume 113. In one implementation, the pressure controller 120 may include valves internally to control the flow of gas in a variable manner. In another implementation, the first valve 118 may be a variable flow valve and the pressure controller 120 may control the first valve 118 to influence the flow of gas from the fluid source 116. Generally, the flow restrictor 122 is a fixed flow apparatus which provides a substantially constant impedance to gas flow from the control volume 113. The pressure controller's flow detection apparatus 138 may also be able to detect when the substrate 114 is dechucked or is misaligned on the vacuum chuck support 112 by detecting a change in flow rate of the gas from the control volume 113. Thus, the pressure controller 120 provides advantageous feedback regarding flow rates to enable more efficient chucking and dechucking of the substrate 114.

The pressure controller 120 is also disposed upstream of any process volume effluent that may enter the control volume 113/third conduit 132 which eliminates exposure of the pressure controller 120 to harmful outgas products. It is contemplated that process volume effluent may enter the control volume 113/third conduit 132 when the substrate 114 is not present or misaligned on the vacuum chuck support 112 and the pump 126 is actively influencing flow from the process volume 108 to the pump along the fluid flow path 134. In another implementation, a unidirectional valve 140, such as a check valve or the like, may be disposed on the first conduit 128 between the pressure controller 120 and the control volume 113. More specifically, the unidirectional valve 140 may be disposed on the first conduit 128 between the pressure controller 120 and the third conduit 132. The position of the unidirectional valve 140, which prevents fluid flow upstream in the first conduit 128, may function to further prevent process volume effluent from reaching the pressure controller 120. In certain implementations, the unidirectional valve 140 may be optional.

The flow restrictor 122 may be disposed on the second conduit 130 between the control volume 113 and the pump 126 as the pump 126 is disposed on the second conduit 130 downstream from the flow restrictor 122 and the control volume 113. The second valve 124 may be disposed on the second conduit 130 along the fluid flow path 134 between the flow restrictor 122 and the pump 126. The second valve 124 may be operated, in combination with the flow restrictor 122, to provide backpressure along the fluid flow path 134 which may be detected by the pressure controller 120. In response to a change in flow detected by the pressure controller 120, the pressure controller may change the pressure of the control volume 113 by increasing or decreasing the gas flow along the fluid flow path 134.

The pump 126, which may be a vacuum pump, is in fluid communication with the control volume 113. Moreover, each of the fluid source 116, the pressure controller 120, and the flow restrictor 122 are in fluid communication with the control volume 113 and the pump 126. The pump 126 may also be fluidly coupled to the process volume 108. The pump 126 may be utilized to generate a vacuum in the process volume 108 and the control volume 113. However, during vacuum chucking of the substrate 114, the pressure controller 120 may exert a greater influence on the pressure maintained in the control volume.

The position of the pressure controller 120 relative to the control volume 113 enables improved substrate chucking performance by enabling the detection, via flow rate sensing, of pressure changes within the control volume 113 and the along the fluid flow path 134. The pressure controller 120 is also upstream of outgassing from the process volume 108, thus, reducing or eliminating exposure of the pressure controller 120 to harmful effluents and extending the useful life of the pressure controller 120. The flow restrictor 122 may be exposed to harmful outgassing as a result of being downstream on the fluid flow path 134 from the control volume 113, however, the flow restrictor 122 is generally more easily and economically replaced. Moreover, by utilizing the pump 126 to generate vacuum in both the process volume 108 and the control volume 113, the need for an additional pump for vacuum chucking is eliminated which reduces the cost of the process apparatus 100.

While the foregoing is directed to implementations of the present disclosure, other and further implementations of the disclosure may be devised without departing from the basic scope thereof, and the scope thereof is determined by the claims that follow.

What is claimed is:
1. A substrate processing apparatus, comprising:
a process chamber which defines a process volume;
a vacuum chuck support for vacuum supporting a substrate disposed within the process volume;
a variable flow valve in fluid communication with the vacuum chuck, wherein the variable flow valve is disposed on a fluid flow path upstream from the vacuum chuck;
a pressure controller comprising a pressure detector and a flow rate detector, the pressure controller disposed in the fluid flow path upstream from the vacuum chuck and located on the fluid flow path between the variable flow valve and the vacuum chuck, wherein the pressure controller being disposed upstream from the vacuum chuck prevents the pressure controller from being exposed to fluid flow from a control volume of the vacuum chuck along the fluid flow path;
a flow restrictor in fluid communication with the vacuum chuck, a control volume of the vacuum chuck, and the variable flow valve during vacuum chucking, wherein the flow restrictor is disposed on the fluid flow path downstream from the vacuum chuck and provides a constant impedance to flow from the control volume;
a second valve disposed downstream of the flow restrictor; and a vacuum pump disposed downstream of the second valve, the vacuum pump in fluid communication with the process volume through a first conduit and the control volume of the vacuum chuck through a second conduit.

2. The apparatus of claim 1, wherein the vacuum pump is in fluid communication with the flow restrictor.

3. The apparatus of claim 1, wherein the control volume is separate from the process volume.

4. The apparatus of claim 3, wherein the control volume is in fluid communication with the variable flow valve.

5. The apparatus of claim 3, wherein the control volume is in fluid communication with the flow restrictor.

6. The apparatus of claim 1, further comprising a check valve disposed downstream of the pressure controller and upstream of the vacuum chuck.

7. The apparatus of claim 1, further comprising a fluid source positioned upstream of the variable flow valve, the fluid source configured to deliver an inert gas pressure within a range of about 15 psi to about 45 psi.

* * * * *